(12) United States Patent
Chen et al.

(10) Patent No.: US 9,601,497 B1
(45) Date of Patent: Mar. 21, 2017

(54) STATIC RANDOM ACCESS MEMORY AND METHOD OF MANUFACTURING THE SAME

(71) Applicant: TAIWAN SEMICONDUCTOR MANUFACTURING CO., LTD., Hsinchu (TW)

(72) Inventors: Ying-Yan Chen, Hsinchu (TW); Jui-Yao Lai, Hsinchu (TW); Sai-Hooi Yeong, Hsinchu (TW); Yen-Ming Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/141,414

(22) Filed: Apr. 28, 2016

(51) Int. Cl.
| | | |
|---|---|---|
| *H01L 27/11* | (2006.01) | |
| *H01L 23/528* | (2006.01) | |
| *H01L 23/532* | (2006.01) | |
| *H01L 29/167* | (2006.01) | |
| *H01L 29/08* | (2006.01) | |
| *H01L 27/092* | (2006.01) | |
| *H01L 21/8238* | (2006.01) | |

(Continued)

(52) U.S. Cl.
CPC .. *H01L 27/1104* (2013.01); *H01L 21/823821* (2013.01); *H01L 21/823871* (2013.01); *H01L 23/528* (2013.01); *H01L 23/53209* (2013.01); *H01L 23/53228* (2013.01); *H01L 23/53257* (2013.01); *H01L 27/0924* (2013.01); *H01L 29/0847* (2013.01); *H01L 29/167* (2013.01); *H01L 29/456* (2013.01); *H01L 29/517* (2013.01)

(58) Field of Classification Search
CPC ............. H01L 27/1104; H01L 29/167; H01L 23/53209; H01L 23/53228; H01L 23/53257; H01L 29/517; H01L 23/528; H01L 27/0924; H01L 21/823821; H01L 21/823871; H01L 29/456; H01L 29/0847
See application file for complete search history.

(56) References Cited

U.S. PATENT DOCUMENTS

| | | | | |
|---|---|---|---|---|
| 6,885,055 B2 * | 4/2005 | Lee | ................... | H01L 29/41791 257/308 |
| 7,378,710 B2 * | 5/2008 | Breitwisch | .............. | H01L 21/84 257/347 |

(Continued)

*Primary Examiner* — William Coleman
(74) *Attorney, Agent, or Firm* — McDermott Will & Emery LLP

(57) ABSTRACT

A Static Random Access Memory (SRAM) cell includes a first pull-up transistor and a first pull-down transistor, a second pull-up transistor and a second pull-down transistor, and first and second pass-gate transistors. A first buried contact electrically connects a drain region of the first pull-up transistor and gate electrodes of the second pull-up transistor and the second pull-down transistor, and includes a first metal layer formed in a region confined by spacers of a first gate layer and a first electrically conductive path formed at a level below the spacers. A second buried contact electrically connects a drain region of the second pull-up transistor and gate electrodes of the first pull-up transistor and the first pull-down transistor, and includes a second metal layer formed in a region confined by spacers of a second gate layer and a second electrically conductive path formed at the level below the spacers.

20 Claims, 18 Drawing Sheets

(51) Int. Cl.
*H01L 29/45* (2006.01)
*H01L 29/51* (2006.01)

(56) References Cited

U.S. PATENT DOCUMENTS

| | | | | |
|---|---|---|---|---|
| 7,479,421 B2* | 1/2009 | Kavalieros | ...... | H01L 21/823431 257/E21.421 |
| 7,781,847 B2* | 8/2010 | Yang | ...... | H01L 21/0334 257/392 |
| 8,338,251 B2* | 12/2012 | Berthold | ...... | H01L 21/84 257/E21.442 |
| 8,455,932 B2* | 6/2013 | Khakifirooz | ...... | H01L 27/0207 257/270 |
| 8,889,494 B2* | 11/2014 | Toh | ...... | H01L 29/66795 438/149 |
| 8,908,420 B2* | 12/2014 | Asayama | ...... | G11C 11/419 365/154 |
| 8,947,912 B2* | 2/2015 | Calhoun | ...... | G11C 11/412 257/369 |

\* cited by examiner

STATIC RANDOM ACCESS MEMORY AND METHOD OF MANUFACTURING THE SAME

TECHNICAL FIELD

The present disclosure is generally related to a static random access memory (SRAM) and a method of manufacturing the same, and more particularly, to an SRAM having buried contacts and a method of manufacturing the same.

BACKGROUND

A static random access memory (SRAM) is commonly used for data storage when the SRAM is supplied with power. To meet the demand in portable electronics and high speed computation, it is desirable to integrate more data storage cells including cross-coupled invertors into a single SRAM chip and to lower power consumption thereof, for example, by replacing conventional transistors with fin field-effect transistors (FinFET) having smaller size and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
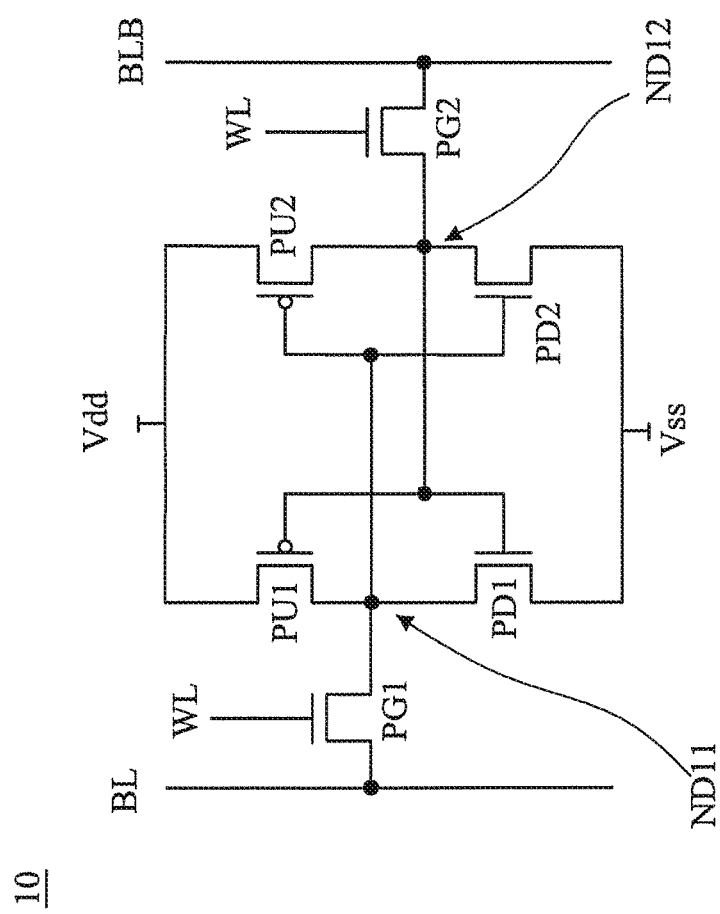
FIG. 1 is an exemplary circuit diagram of an SRAM cell according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Although in the present disclosure, a circuit diagram, a layout, and a method of manufacturing a single static random access memory (SRAM) cell are explained, it should be appreciated that an SRAM generally includes a plurality of SRAM cells arranged in an array. Adjacent SRAM cells may be arranged symmetrically to each other. In such an SRAM, wordlines of the SRAM cells in the same row of the array may be connected to each other, bitlines of the SRAM cells in the same column of the array may be connected to each other, and power supply nodes of the SRAM cells in the same row or the same column may be connected to each other.

It should be appreciated that specifying source and drain regions, or source and drain electrodes of the same transistor in the present disclosure is merely to distinguish the source and drain regions from each other or to distinguish the source and drain electrodes from each other. The source and drain regions of the same transistor can be alternatively referred to as drain and source regions, respectively, and the source and drain electrodes of the same transistor can be alternatively referred to as drain and source electrodes, respectively.

In the present disclosure, when gate electrodes of two or more transistors are formed by the same layer and are electrically connected to each other by the same layer, the same layer is referred to as a gate layer.

FIG. 1 is an exemplary circuit diagram of an SRAM cell according to one embodiment of the present disclosure. Referring to FIG. 1, an SRAM cell 10 includes a first pull-up transistor PU1, a first pull-down transistor PD1, and a first pass-gate transistor PG1. Drain electrodes of the first pull-up transistor PU1, the first pull-down transistor PD1, and the first pass-gate transistor PG1 are electrically connected at a first data storage node ND11. The SRAM cell 10 further includes a second pull-up transistor PU2, a second pull-down transistor PD2, and a second pass-gate transistor PG2. Drain electrodes of the second pull-up transistor PU2, the second pull-down transistor PD2, and the second pass-gate transistor PG2 are electrically connected at a second data storage node ND12.

Gate electrodes of the second pull-up transistor PU2 and the second pull-down transistor PD2 are electrically connected to the drain electrodes of the first pull-down transistor PD1, the first pass-gate transistor PG1, and the first pull-up transistor PU1 through the first data storage node ND11. Gate electrodes of the first pull-up transistor PU1 and the first pull-down transistor PD1 are electrically connected to the drain electrodes of the second pull-down transistor PD2, the second pass-gate transistor PG2, and the second pull-up transistor PU2 through the second data storage node ND12.

Source electrodes of the first and second pull-down transistors PD1 and PD2 are connected to a first power supply node Vss, while source electrodes of the first and second pull-up transistors PU1 and PU2 are connected to a second power supply node Vdd. According to some embodiments, the first power supply node Vss is electrically connected to a ground, and the second power supply node Vdd is electrically connected to a positive electrical potential, supplied from a power supply circuit (not shown) of the SRAM.

Gate electrodes of the first and second pass-gate transistors PG1 and PG2 are connected to a wordline WL. Source electrodes of the first and second pass-gate transistors PG1 and PG2 are connected to first and second bitlines BL and BLB, respectively.

As shown in FIG. 1, the first and second pass-gate transistors PG1 and PG2 and the first and second pull-down transistors PD1 and PD2 are N-type transistors, and the first and second pull-up transistors PU1 and PU2 are P-type transistors. The present disclosure is not limited thereto. According to other embodiments, the first and second pass-gate transistors PG1 and PG2 and the first and second pull-down transistors PD1 and PD2 are P-type transistors, and the first and second pull-up transistors PU1 and PU2 are N-type transistors. In such a case, polarities of the power supply node are also changed.

Figure 2:
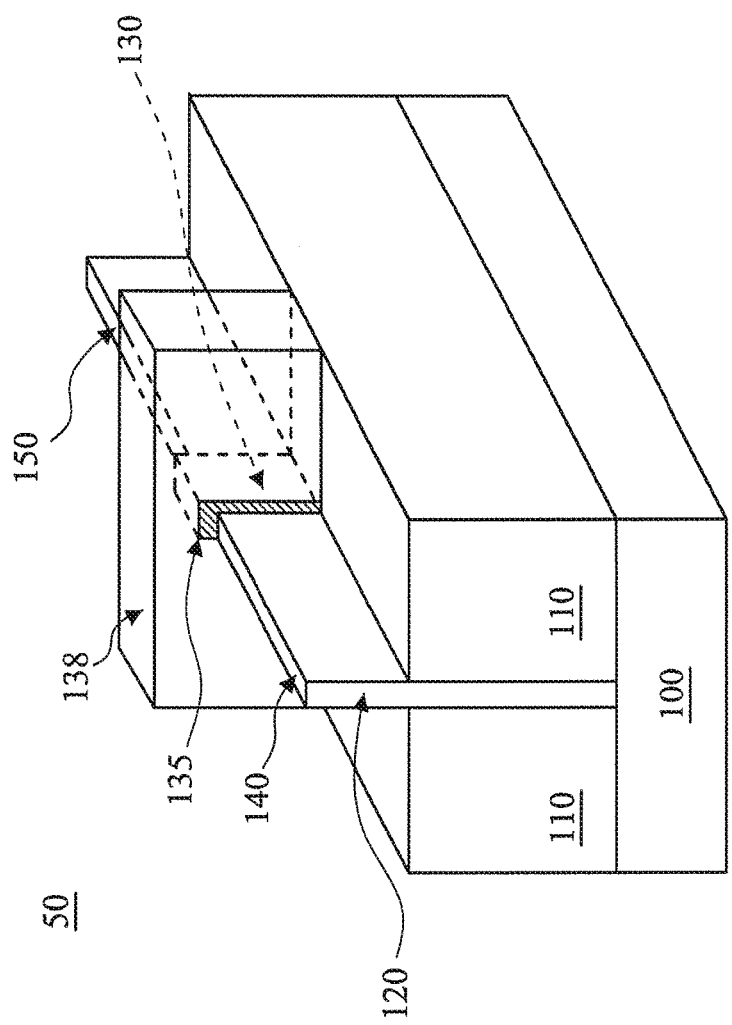
FIG. 2 is a perspective view of a fin field-effect transistor (FinFET) which can be employed to implement an SRAM cell according to an embodiment of the present disclosure.

FIG. 2 is a perspective view of a fin field-effect transistor (FinFET) which can be employed to implement an SRAM cell according to an embodiment of the present disclosure.

Referring to FIG. 2, a FinFET 50 includes a semiconductor fin 120 protruding from a substrate 100, for example, a silicon substrate. The semiconductor fin 120 can be formed by trench-etching the substrate or an epitaxially grown layer. A lower portion of the semiconductor fin 120 is interposed between isolation regions 110 formed over the substrate 100. The isolation regions 110 are Shallow Trench Isolation (STI) regions as an example to be described next. The present disclosure, however, is not limited thereto. According to other embodiments, the isolation regions 110 can be field oxide regions.

As shown in FIG. 2, the FinFET 50 further includes a source region 140 and a drain region 150 and a channel region 130 interposed therebetween. The source region 140, the drain region 150, and the channel region 130 of the FinFET 50 are made of an upper portion of the semiconductor fin 120 at a level higher than the isolation regions 110. The source and drain regions 140 and 150 are heavily doped and can contain impurities having a concentration in a range from about $5\times10^{19}$ cm$^{-3}$ to $1\times10^{20}$ cm$^{-3}$. Although not shown in FIG. 2, a silicide may be formed over the source region 140 and the drain region 150 to improve electrical conductivity thereof.

A gate electrode 138 made of, for example, a metal layer such as tungsten and/or other work function adjustment metals, is formed over the channel region 130, and extends to cover sidewalls of the channel region 130. Although not shown, a barrier layer may be formed prior to the metal layer of the gate electrode so as to promote adhesion of the later formed metal layer of the gate electrode. The FinFET 50 also has a gate insulating layer 135 formed of, for example, a high-k dielectric material such as a metal oxide including oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixture and an interfacial dielectric such as silicon oxide below the high-k dielectric material. The gate insulating layer 135 is interposed between the gate electrode 138 and the channel region 130 to electrically isolate them from each other.

Although not shown in FIG. 2, according to some embodiments, two or more FinFETs may be formed primarily based on the same semiconductor fin 120. In this case, source and drain regions and channel regions of the two or more FinFETs may be formed by the same semiconductor fin 120. The drain regions (or the source regions), which are disposed between the channel regions of two immediately adjacent FinFETs, are thus directly coupled to each other.

It should be appreciated that metal contacts may be formed over the source and drain regions 140 and 150 and/or the gate electrode 138, to electrically connect the source and drain regions 140 and 150 and/or the gate electrode 138 to various metal layers over the FinFET 50. Such features will be more apparent with reference to FIGS. 3 and 4 below.

Figure 3:
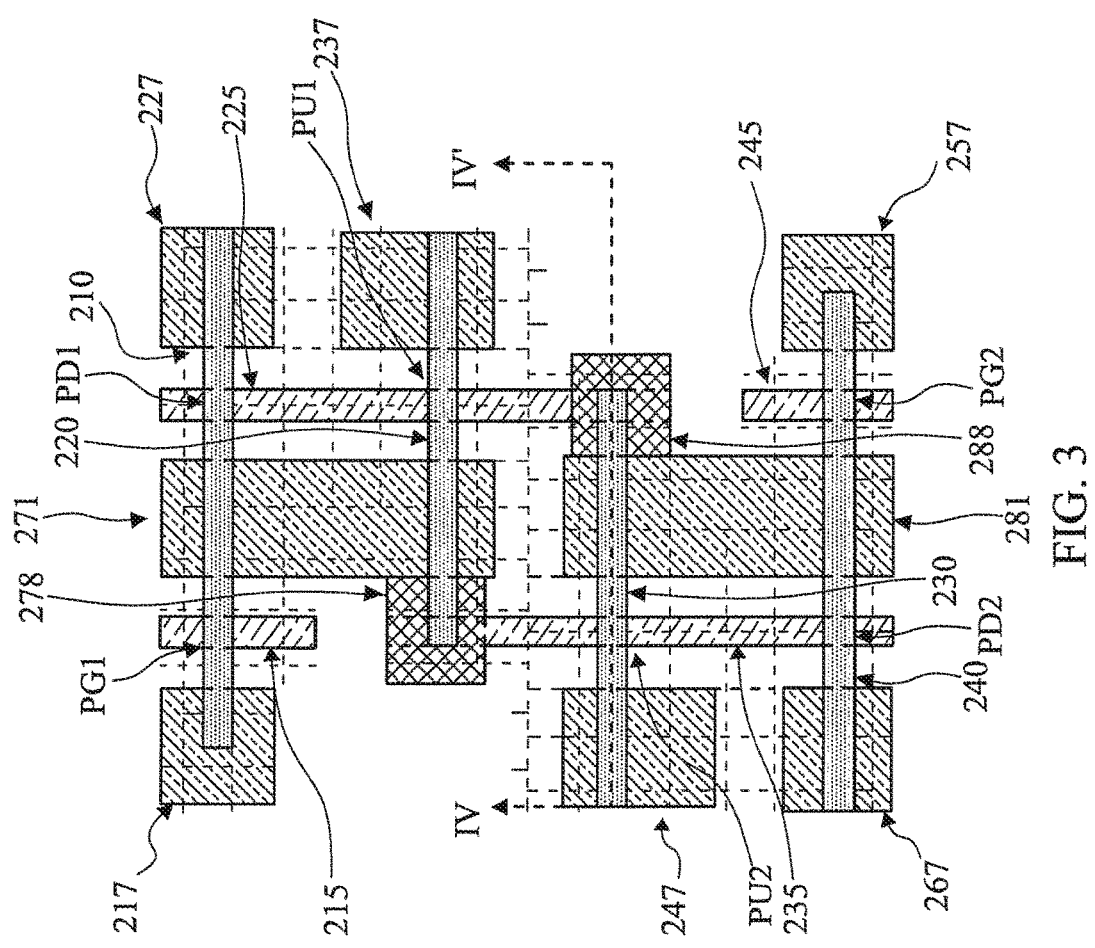
FIG. 3 illustrates a simplified layout of an SRAM cell according to an embodiment of the present disclosure.

FIG. 3 illustrates a simplified layout of an SRAM cell according to an embodiment of the present disclosure, in which only the layout of semiconductor fins, gate electrodes/layers, metal contacts are illustrated. The aforementioned FinFET 50 can be employed to implement various transistors of the SRAM cell.

Referring to FIG. 3, an SRAM cell 10 includes a first pass-gate transistor PG1 and a first pull-down transistor PD1, drain regions of which are directly coupled to each other by a central portion of a first semiconductor fin 210. First and second metal contacts 217 and 227, which can be electrically connected to a first bitline (see BL in FIG. 1) and a first power supply node (see Vss in FIG. 1), respectively, are formed over source regions of the first pass-gate transistor PG1 and the first pull-down transistor PD1 located at opposite ends of the first semiconductor fin 210. A gate electrode 215 of the first pass-gate transistor PG1 formed over a channel region thereof can be electrically connected to a wordline (see WL in FIG. 1).

Further, the SRAM cell 10 includes a first pull-up transistor PU1, source, drain, and channel regions which are formed of a second semiconductor fin 220. A second pull-up transistor PU2 of the SRAM cell 10 includes source, drain, and channel regions which are formed of a third semiconductor fin 230. Third and fourth metal contacts 237 and 247, which can be electrically connected to a second power supply node (see Vdd in FIG. 1), are formed over the source region of the first pull-up transistor PU1 located at one side of the SRAM cell 10 and the source region of the second pull-up transistor PU2 located at another side of the SRAM cell 10, respectively.

As shown in FIG. 3, the SRAM cell 10 further includes a second pass-gate transistor PG2 and a second pull-down transistor PD2, drain regions of which are directly coupled to each other by a central portion of a fourth semiconductor fin 240. Fifth and sixth metal contacts 257 and 267, which can be electrically connected to a second bitline (see BLB in FIG. 1) and the first power supply node (see Vss in FIG. 1), respectively, are formed over source regions of the first pass-gate transistor PG1 and the first pull-down transistor PD1 located at opposite ends of the fourth semiconductor fin 240. A gate electrode 245 of the second pass-gate transistor PG2 formed over a channel region thereof can be electrically connected to the wordline (see WL in FIG. 1).

The first through fourth semiconductor fins 210, 220, 230, and 240 are sequentially arranged and separated from one another by isolation regions (refer to isolation regions 110 in FIG. 2).

Referring still to FIG. 3, the SRAM cell 10 also includes a seventh metal contact 271 formed over the first semiconductor fin 210 to electrically connect to the drain regions of the first pass-gate transistor PG1 and the first pull-down transistor PD1 and over the drain region of the first pull-up transistor PU1 to electrically connect to the drain region of the first pull-up transistor PU1. Thus, the drain regions of the first pass-gate transistor PG1 and the first pull-down transistor PD1 and the drain region of the first pull-up transistor PU1 are electrically connected to each other by the seventh metal contact 271. Similarly, an eighth metal contact 281 of the SRAM cell 10 is formed over the fourth semiconductor fin 240 to electrically connect to the drain regions of the second pass-gate transistor PG2 and the second pull-down transistor PD2 and over the drain region of the second pull-up transistor PU2 to electrically connect to the drain region of the second pull-up transistor PU2. Thus, the drain regions of the second pass-gate transistor PG2 and the second pull-down transistor PD2 and the drain region of the second pull-up transistor PU2 are electrically connected to each other by the eighth metal contact 281. The first through eight metal contacts, 217, 227, 237, 247, 257, 267, 271, and 281, are made of metal including at least one of tungsten, cobalt, titanium, copper, and a combination thereof.

As shown in FIG. 3, the SRAM cell 10 has a first gate layer 225 by which the gate electrodes of the first pull-up transistor PU1 and the first pull-down transistor PD1 are formed, and a second gate layer 235 by which the gate electrodes of the second pull-up transistor PU2 and the second pull-down transistor PD2 are formed. The first gate layer 225 is electrically connected to the drain regions of the first pass-gate transistor PG1, the first pull-down transistor PD1, and the first pull-up transistor PU1, and the second gate layer 235 is electrically connected to the drain regions of the second pass-gate transistor PG2, the second pull-down transistor PD2, and the second pull-up transistor PU2. Such features will be more apparent with reference to FIG. 4 to be described next.

Figure 4:
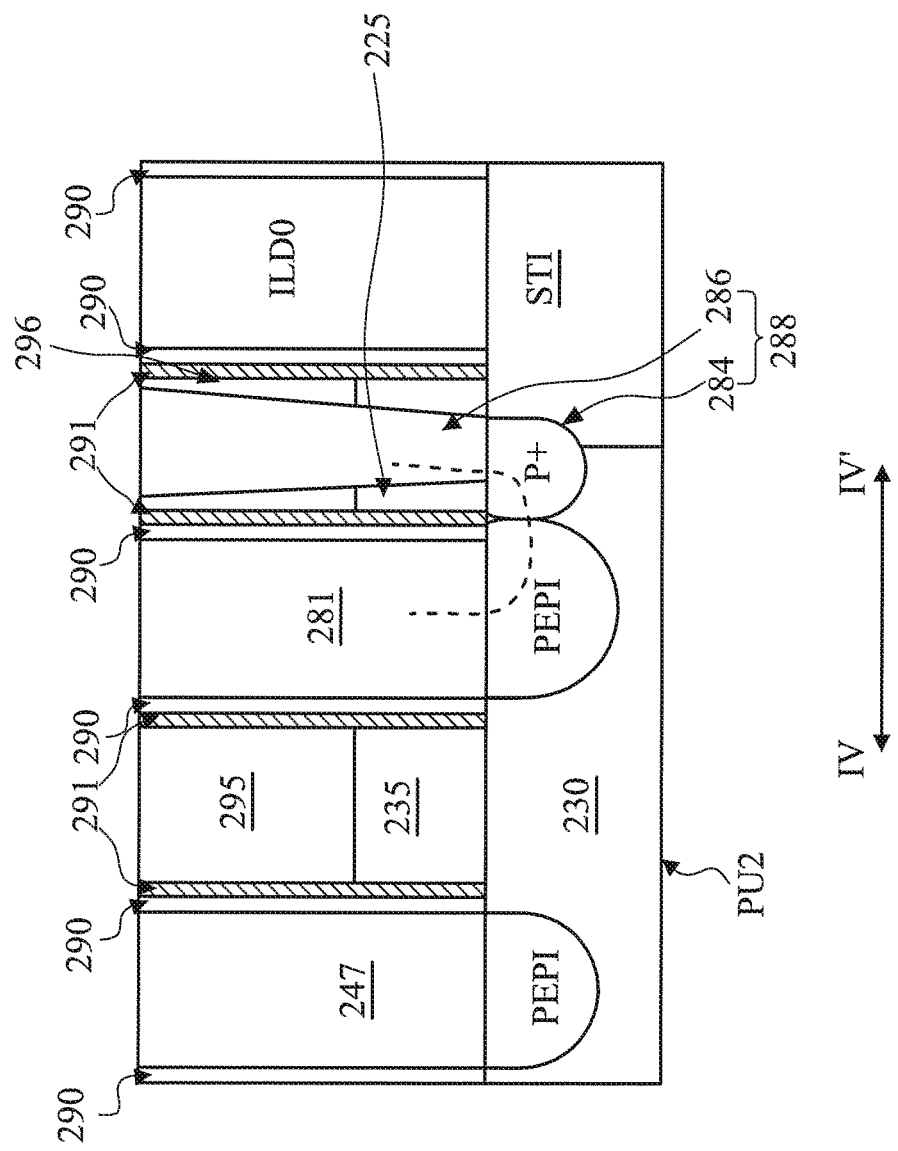
FIG. 4 is a schematic cross-sectional view taken along line IV-IV' of FIG. 3.

FIG. 4 is a schematic cross-sectional view taken along line IV-IV' of FIG. 3. For convenience of illustration, although gate insulating layers formed below the first and second gate layers 225 and 235 are omitted in FIG. 4, one of ordinary skill should recognize that the gate insulating layers of the respective transistors can be appropriately formed with reference to the gate insulating layer 135 shown in FIG. 2.

Referring to FIG. 4, the fourth metal contact 247, the second gate layer 235, the eighth metal contact 281, and the first gate layer 225 are separated from each other by dielectric 290 formed therebetween. The fourth and eighth metal contacts 247, 281 are disposed over source or drain regions formed by a P-type epitaxial layer PEPI, respectively. Although not shown in FIG. 4, according to one embodiment, contact etching stop layers (CESL) are formed on the sidewalls of the dielectric 290. Thus, the dielectric 290 correspond to the boundaries of the regions on which the aforementioned metal contacts and gate electrodes/layers are formed.

Referring to FIGS. 3 and 4, a metal layer 286 is formed in a region confined by the dielectric 290 and spacers 291 of the first gate layer 225 by which the gate electrodes of the first pull-up transistor PU1 and the first pull-down transistor PD1 are formed. The metal layer 286 is made of the same material as the aforementioned metal contacts 247, 281 and is located at the same level as the aforementioned metal contacts 247, 281. The metal layer 286 penetrates through the first gate layer 225 so as to electrically connect to a doped semiconductor region 284. The doped semiconductor region 284 contains heavily doped impurities, such as P-type impurities including boron, gallium, indium, and a combination thereof, with concentration from about $5\times10^{19}$ cm$^{-3}$ to about $1\times10^{20}$ cm$^{-3}$, which is the same level as that of the source or drain regions PEPIs. Accordingly, the doped semiconductor region 284 has a suitable electrical conductivity to electrically connect the drain region PEPI of the second pull-up transistor PU2 to the metal layer 284. Thus, an electrically conductive path is formed from the first gate layer 225, by which the gate electrodes of the first pull-down transistor PD1 and the first pull-up transistor PU1 are formed, to the drains of the second pass-gate transistor PG2 and the second pull-down transistor PD2, by sequentially passing through the metal layer 286 formed in the region confined by the dielectric 290 and the spacer 291 of the first gate layer 225, the doped semiconductor region 284, the drain region PEPI of the second pull-up transistor PU2, and the eight metal contact 281. Accordingly, the drain regions of the second pass-gate transistor PG2, the second pull-down transistor PD2, the second pull-up transistor PU2, and the gate electrodes of the first pull-up transistor PU1 and the first pull-down transistor PD1 are electrically connected by an interconnection structure including the eighth metal contact 281 and a buried contact 288 including the doped semiconductor region 284 and the metal layer 286. Further, when dielectric layers 295 and 296 made of such as silicon nitride, silicon carbide, silicon oxide, and other suitable materials are formed over the second gate layer 235 and the first gate layer 225, respectively, the metal layer 286 penetrates the dielectric layer 296 and the first gate layer 225.

Similarly, an electrically conductive path can be formed from the second gate layer 235, by which the gate electrodes of the second pull-down transistor PD2 and the second pull-up transistor PU2 are formed, to the drains of the first pass-gate transistor PG1 and the first pull-down transistor PD1, by sequentially passing through another metal layer (not shown in FIG. 4) formed in the region confined by the dielectric 290 and the spacer 291 of the second gate layer 235 by which the gate electrodes of the second pull-down transistor PD2 and the second pull-up transistor PU2, another doped semiconductor region (not shown in FIG. 4), the drain region of the first pull-up transistor PU1, and the seventh metal contact 271. Accordingly, the drain regions of the first pass-gate transistor PG1, the first pull-down transistor PD1, the first pull-up transistor PG1, and the gate electrodes of the second pull-up transistor PU2 and the second pull-down transistor PD2 are electrically connected by another interconnection structure including the seventh metal contact 271 and another buried contact 278 including the other doped semiconductor region and the other metal layer.

It should be appreciated that the aforementioned interconnection structure including the buried contact can be employed in SRAM cells having different layouts from the aforementioned embodiment. By using such buried contacts, instead of butted contacts to connect metal contacts and gate electrodes/layers, insufficient overlay budget and potential short-circuit, common issues in SRAM when pitch continues to shrink to meet density requirement for FinFET below 10 nm, can be avoided.

FIGS. 5A through 5G are cross-sectional views illustrating a method of manufacturing a buried contact employed in an SRAM cell according to an embodiment of the present disclosure. For convenience of description, only cross-sectional views along line IV-IV' in FIG. 4 are illustrated.

First, a basic structure of the SRAM cell, including the layer at the level of the semiconductor fin in which source and drains and channels therebetween are formed and the layer at the level of the gate electrode layers, is formed. To make the basic structure shown in FIG. 5A, the third semiconductor fin 230 is fabricated over a substrate (not shown). The third semiconductor fin 230 includes a bottom portion and an upper portion as a channel region. The substrate is, for example, a p-type silicon substrate with an impurity concentration in a range from about $1\times10^{15}$ cm$^{-3}$ to about $1\times10^{18}$ cm$^{-3}$. In other embodiments, the substrate is an n-type silicon substrate with an impurity concentration in a range from about $1\times10^{15}$ cm$^{-3}$ to about $1\times10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the third semiconductor fin 230, an isolation insulating layer STI is formed over the third semiconductor fin 230. The isolation insulating layer STI includes one or more layers of insulating materials such as silicon oxide, silicon oxynitride or silicon nitride, formed by LPCVD, plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer STI over the third semiconductor fin 230, a planarization operation is performed so as to remove part of the isolation insulating layer STI. The planarization operation may include a chemical mechanical polishing (CMP) and/or an etch-back process. Then, the isolation insulating layer STI is further removed (recessed) so that the upper portion of the third semiconductor fin 230 is exposed.

A dummy gate structure is formed over the exposed portion of the third semiconductor fin 230. The dummy gate structure includes a dummy gate electrode layer made of poly silicon and a dummy gate dielectric layer. Sidewall dielectric 290 and spacer 291 including one or more layers of insulating materials are also formed on sidewalls of the dummy gate electrode layer. After the dummy gate structure is formed, the third semiconductor fin 230 not covered by the dummy gate structure is recessed below the upper surface of the isolation insulating layer STI. Then, source/drain regions PEPI are formed over the recessed fin structure by using an epitaxial growth method.

Then, an interlayer dielectric layer ILD0 is formed over the dummy gate structure and the source/drain region PEPI. The interlayer dielectric layer ILD0 includes one or more layers of silicon oxide, SiOC, SiOCN or SiCN or other low-k materials, or porous materials. After a planarization operation, the dummy gate structure is removed so as to make a gate space. Then, in the gate space, a gate insulating layer such as a high-k dielectric layer (not shown) and the gate electrode layers 235 and 225 are formed. Further, the cap insulating layers 295 and 296 are formed over the gate electrode layers 235 and 225, respectively.

Figure 5A:
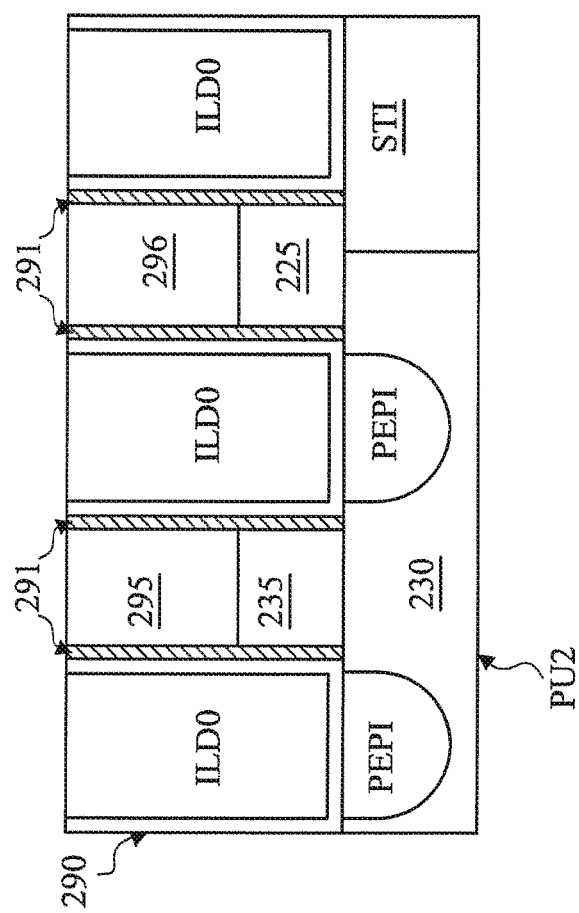
FIGS. 5A through 5G are cross-sectional views illustrating a method of manufacturing a buried contact employed in an SRAM cell according to an embodiment of the present disclosure.
Figure 5B:
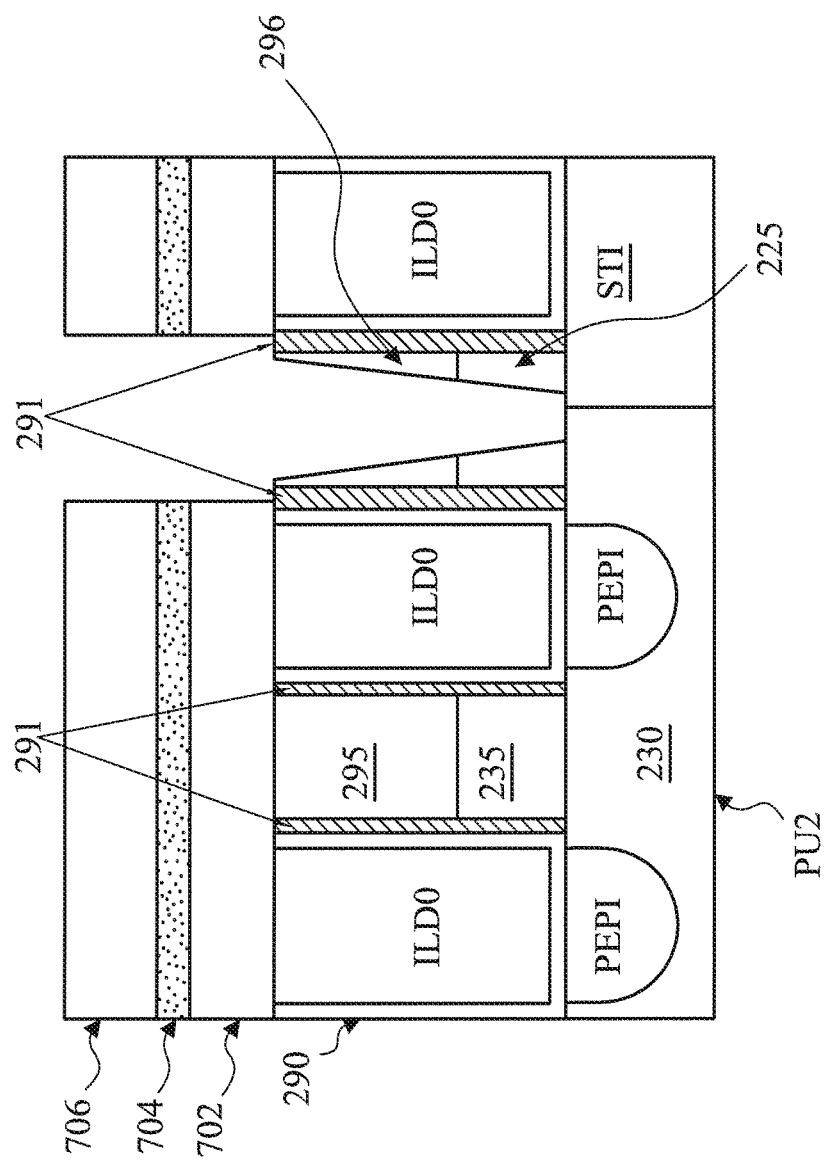

As shown in FIG. 5B, a contact etching stop layer (CESL) 702 formed of a dielectric layer such as silicon nitride, a masking layer 704 such as TiN, and a photoresist layer 706 are sequentially formed over the basic structure of the SRAM cell shown in FIG. 5A. The photoresist layer 706 is patterned to form an opening corresponding to the region of the buried contact to be formed subsequently. An etching process is then performed by using the patterned photoresist layer 706 as an etching mask layer, such that a hole defined by the pattern of the photoresist layer 706 and penetrating through the masking layer 704, and the CESL 702, the dielectric layer 296, and the first gate layer 225 is formed.

Figure 5C:
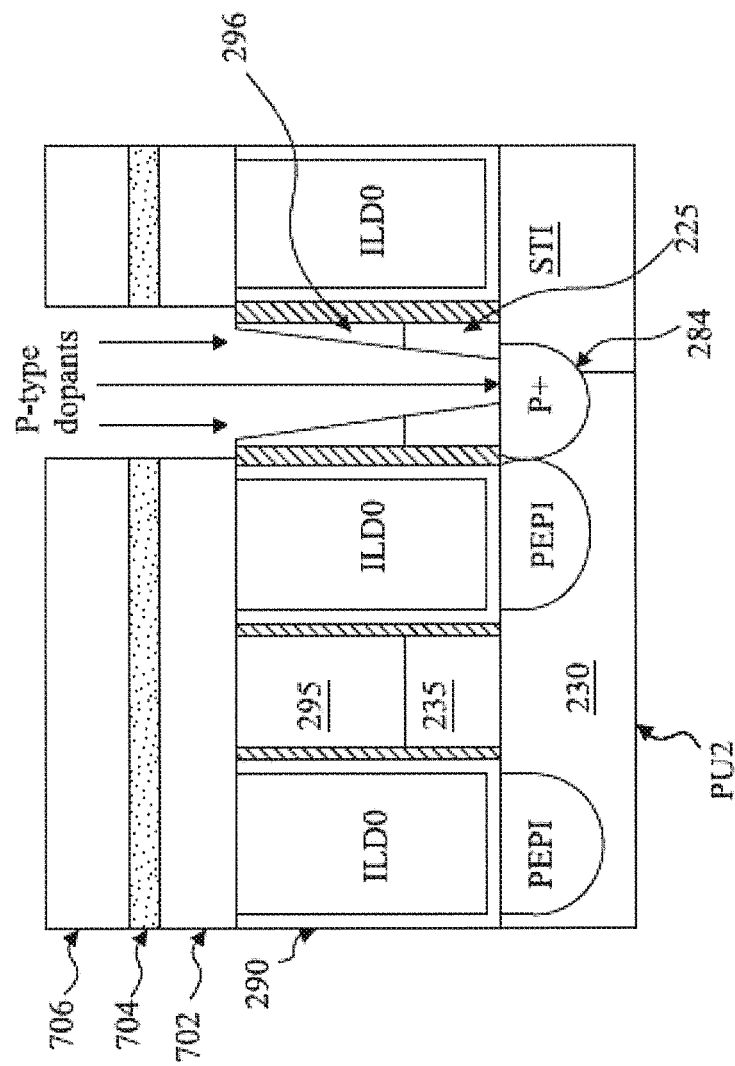

Next, as shown in FIG. 5C, an ion implantation process using P-type dopants, such as $BF_2$, B, and In, as an implantation source is performed to convert a portion of the third semiconductor fin 230 into a doped semiconductor region 284. Thus, the doped semiconductor region 284 and the source/drain region PEPI of the second pull-up transistor PU2 that is immediately adjacent to the doped semiconductor region 284 are electrically connected to each other.

Figure 5D:
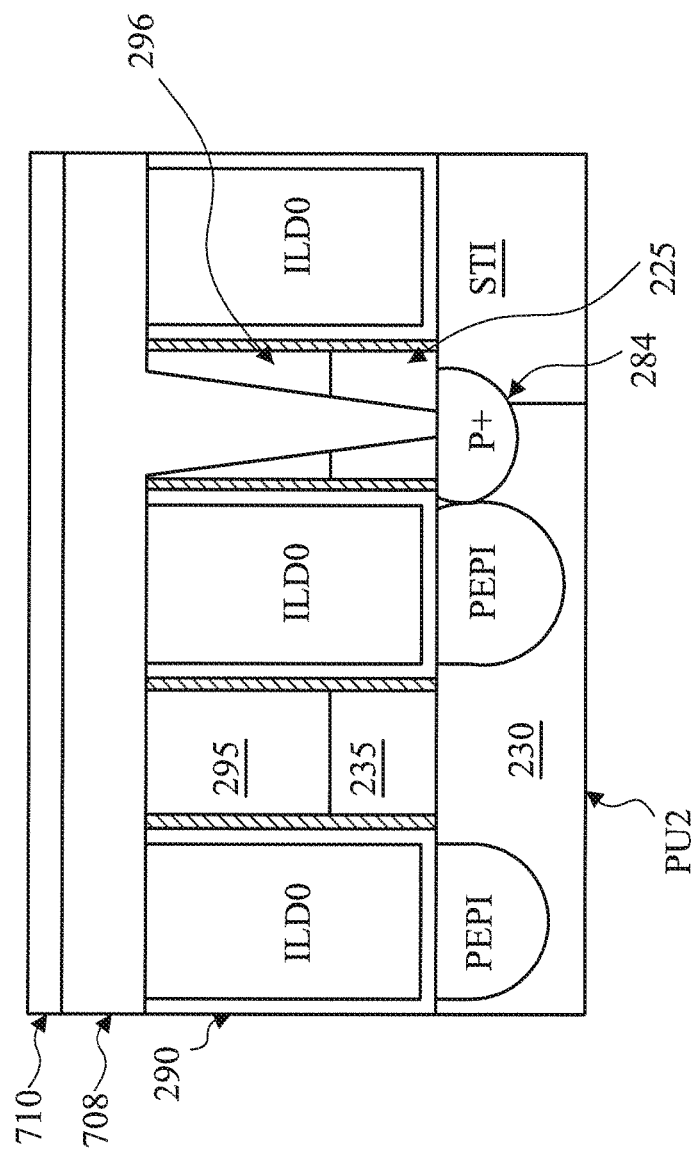

Referring to FIG. 5D, after removing the photoresist layer 706, the masking layer 704 and the CESL 702, another inter-level dielectric 708, which, for example, is made of silicon oxide, is filled in the hole previously formed. The inter-level dielectric 708 is formed also on the surface of the basic structure. Then, after a chemical-mechanical polishing (CMP) process, another mask layer 710, such as TiN, is formed over the planarized inter-level dielectric 708. Thereafter, a photoresist layer (not shown) is coated and patterned to expose the regions corresponding to the fourth metal 247, the eighth metal contact 281, and the metal layer 286. The patterns of the photoresist layer are transferred to the mask layer 710 to expose portions of the inter-level dielectric 708.

Figure 5E:
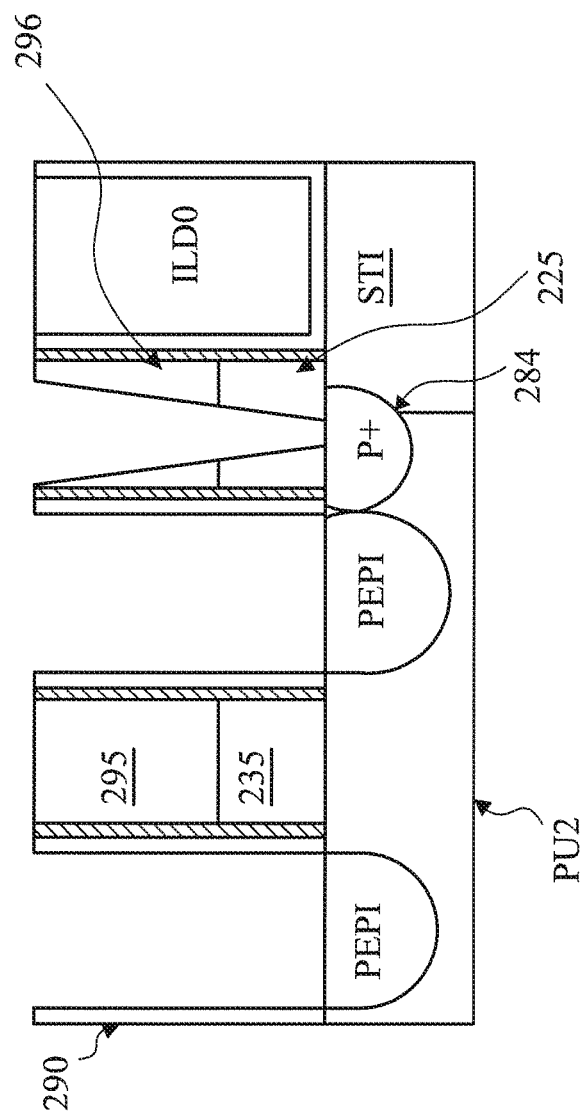

Next, as shown in FIG. 5E, the portions of the inter-level dielectric ILD0 over the source and drain regions PEPI of the second pull-up transistor PU2 and the inter-level dielectric 708 over the doped semiconductor region 284 are removed by using the masking layer 710 as an etching masking layer.

Figure 5F:
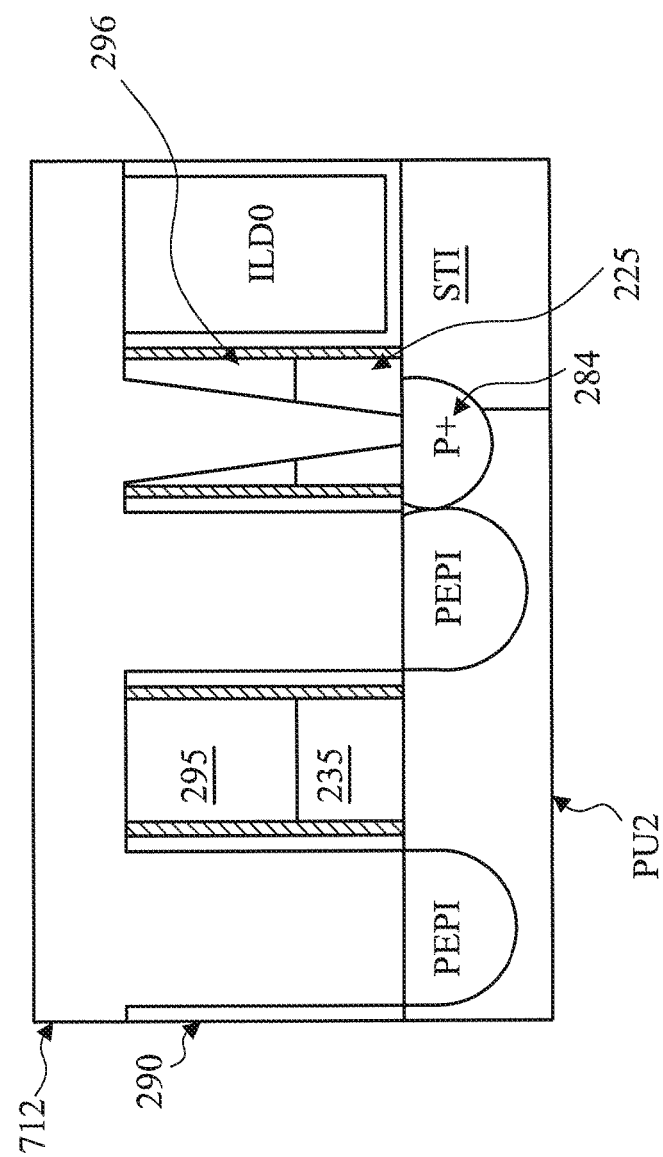

Then, as shown in FIG. 5F, a metal 712, such as tungsten, cobalt, titanium, copper, and a combination thereof, is deposited over the structure formed in FIG. 5E. Although not shown, an adhesion layer to promote adhesion of the metal 712 may be formed prior to forming the metal 712. The metal 712 also fills the space in which the inter-level dielectric 708 and the inter-level dielectric ILD0 are removed.

Figure 5G:
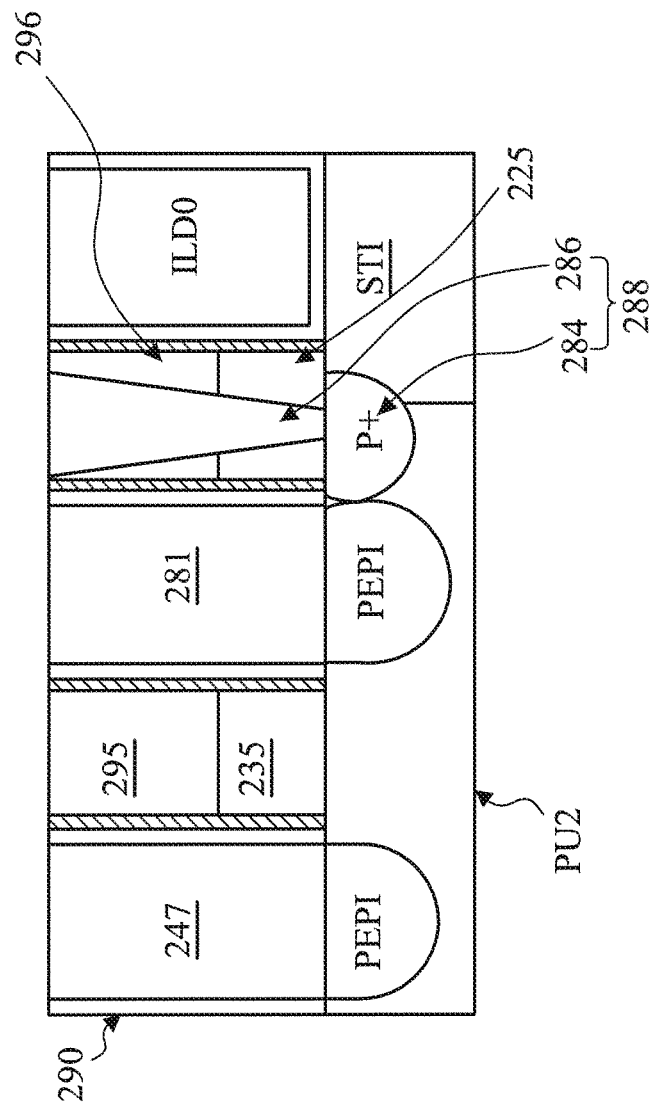

As shown in FIG. 5G, after a CMP process is performed, the metal layer 712 deposited in FIG. 5F is converted into the fourth metal 247, the eighth metal contact 281, and the metal layer 286. In this case, the fourth metal 247, the eighth metal contact 281, and the metal layer 286 are formed of the same material. As shown in FIG. 5G, the fourth metal 247 and the eighth metal contact 281 are electrically connected to the source and drain regions PEPI of the second pull-up transistor PU2, and the metal layer 286 is electrically connected to the doped semiconductor region 284 and the first gate layer 225. According to this embodiment, the buried contact 288 includes the doped semiconductor region 284 and the metal layer 286.

Figure 6A:
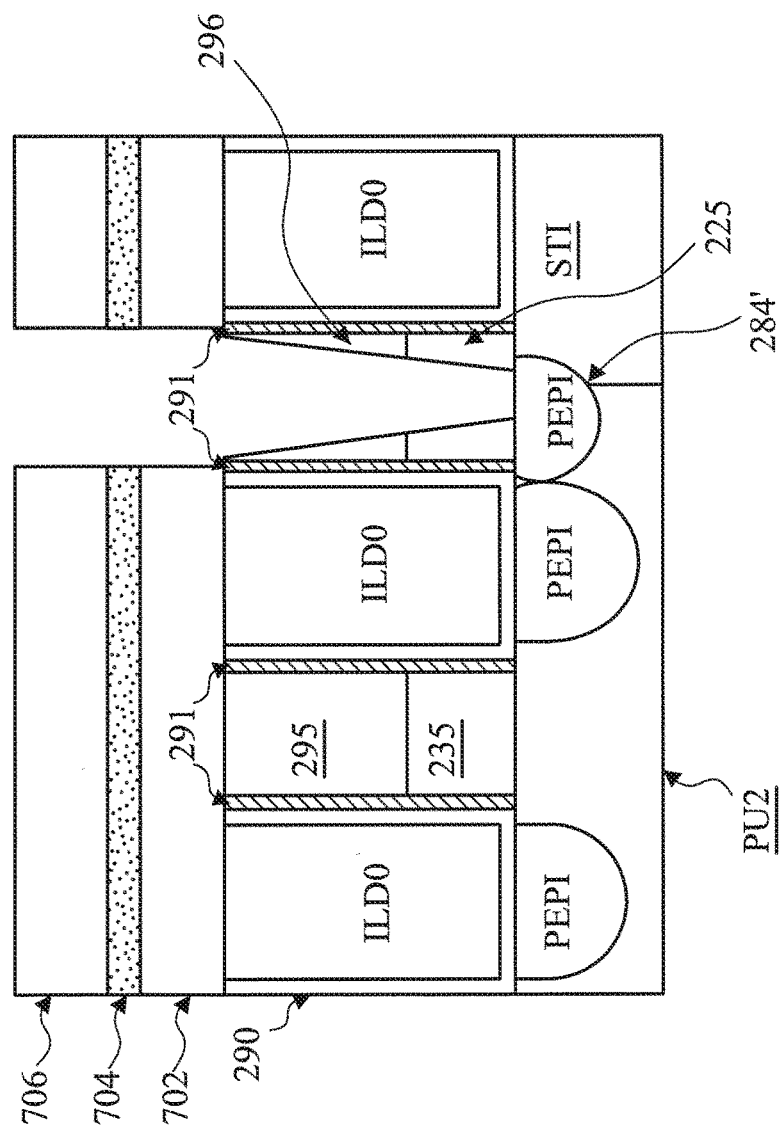
FIGS. 6A and 6B are cross-sectional views illustrating another method of manufacturing a buried contact employed in an SRAM cell according to an embodiment of the present disclosure.
Figure 6B:
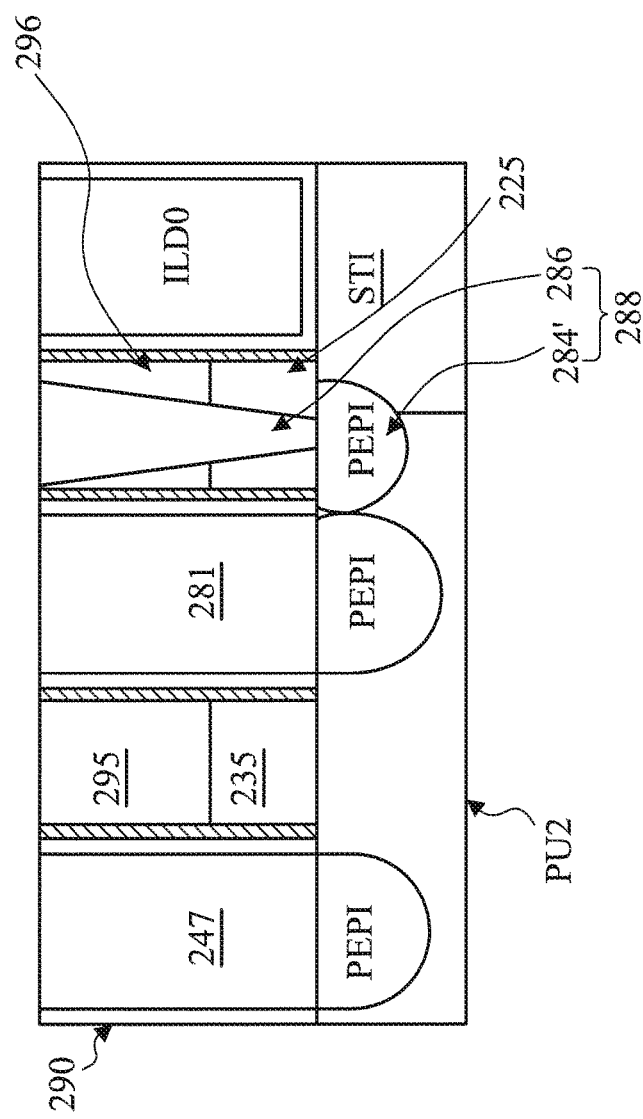

FIGS. 6A and 6B are cross-sectional views illustrating another method of manufacturing a buried contact employed in an SRAM cell according to an embodiment of the present disclosure.

According to the present embodiment, as shown in FIG. 6A, a P-type epitaxial region 284' is formed by an epitaxial growth method, instead of ion implantation of P-type dopants as shown in FIG. 5C. All the other manufacturing steps according to the present embodiment are substantially the same as the manufacturing steps illustrated in FIGS. 5A, 5B, and 5D-5G; therefore, an overlapped description is omitted to avoid redundancy. Thus, referring to FIG. 6B, in this embodiment, the buried contact 288 in this embodiment includes the P-type epitaxial region 284' and the metal layer 286. The P-type epitaxial region 284' can be formed at the same time as the source and drain regions PEPI, as an extended part of the source and drain regions PEPI.

Figure 7A:
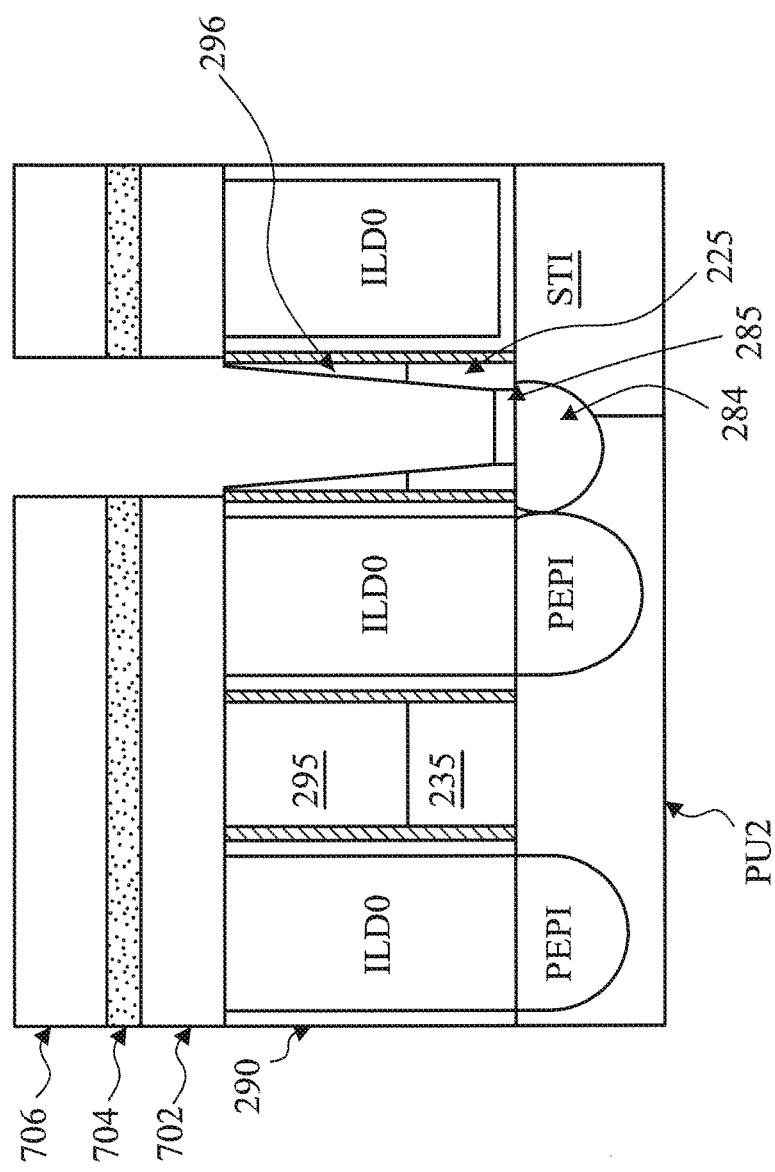
FIGS. 7A and 7B are cross-sectional views illustrating another method of manufacturing a buried contact employed in an SRAM cell according to an embodiment of the present disclosure.
Figure 7B:
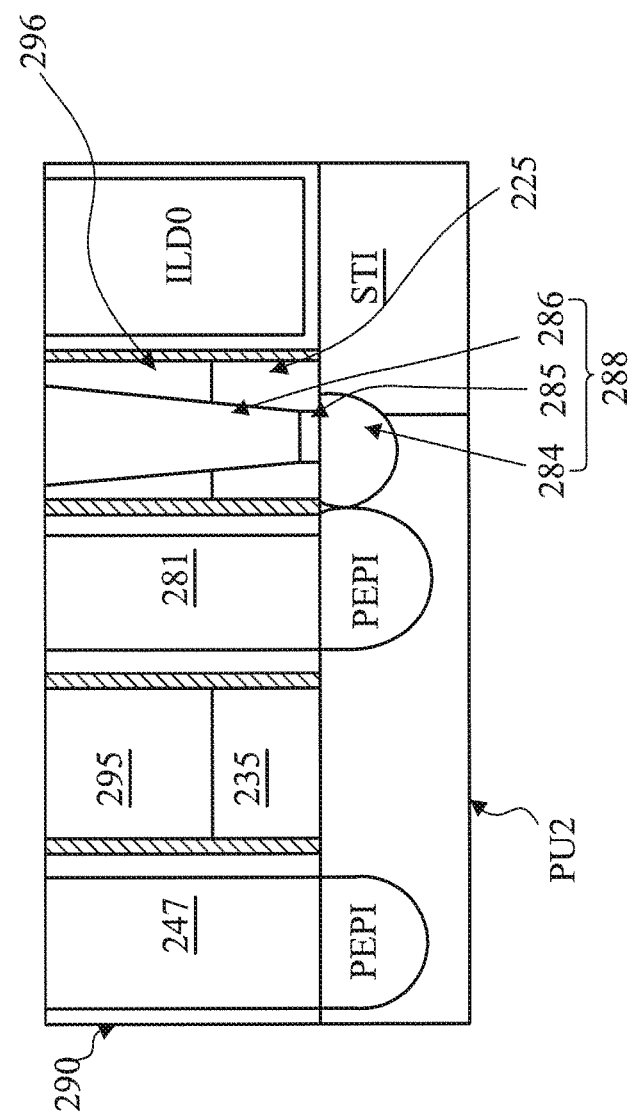

FIGS. 7A and 7B are cross-sectional views illustrating another method of manufacturing a buried contact employed in an SRAM cell according to an embodiment of the present disclosure.

According to the present embodiment, as shown in FIG. 7A, similar to the step shown in FIG. 5C, a doped semiconductor region 284 is formed by ion implantation of P-type dopants. In addition, in this embodiment, to reduce contact resistance between the doped semiconductor region 284 and the metal layer 286 to be formed later, a silicide layer 285 such as TiSi, TaSi, NiSi, CoSi, and a combination thereof is additionally formed on the doped semiconductor region 284. All the other manufacturing steps according to the present embodiment are substantially the same as the manufacturing operations illustrated in FIGS. 5A, 5B, and 5D-5G; therefore, an overlapped description is omitted to avoid redundancy. Thus, as shown in FIG. 7B, the buried contact 288 in this embodiment includes the doped semiconductor region 284, the silicide layer 285, and the metal layer 286.

FIGS. 8A and 8B, FIGS. 9A and 9B, and FIGS. 10A and 10B are cross-sectional views illustrating various methods of manufacturing a buried contact employed in an SRAM cell according to embodiments of the present disclosure.

Figure 8A:
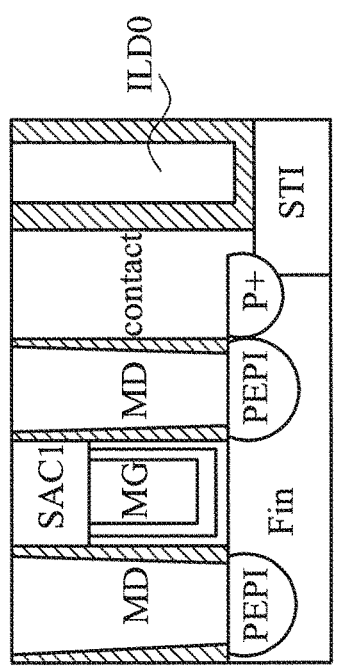
FIGS. 8A and 8B, FIGS. 9A and 9B, and FIGS. 10A and 10B are cross-sectional views illustrating various methods of manufacturing a buried contact employed in an SRAM cell according to embodiments of the present disclosure.
Figure 8B:
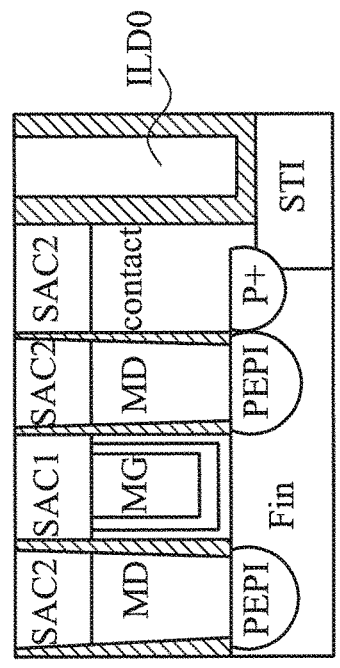

In accordance with one embodiment of the present disclosure, the contact can be formed after a self-aligned-contact (SAC) layer is formed over the metal gate layer MG as shown in FIG. 8A. Accordingly, the structure after forming the contacts, as shown in FIG. 8B, includes a cap layer SAC1 such as silicon nitride, silicon carbide, silicon oxide covering the metal gate layer MG, and a cap layer SAC2 such as silicon nitride, silicon carbide, silicon oxide but different from the cap layer SAC1 over the metal contacts MD covering the source and drain regions PEPI and the contact covering the doped semiconductor region P+. According to this embodiment, the contact covering the doped semiconductor region P+ and the metal contacts covering the source and drain regions PEPI can be simultaneously formed and made of the same material.

Figure 9A:
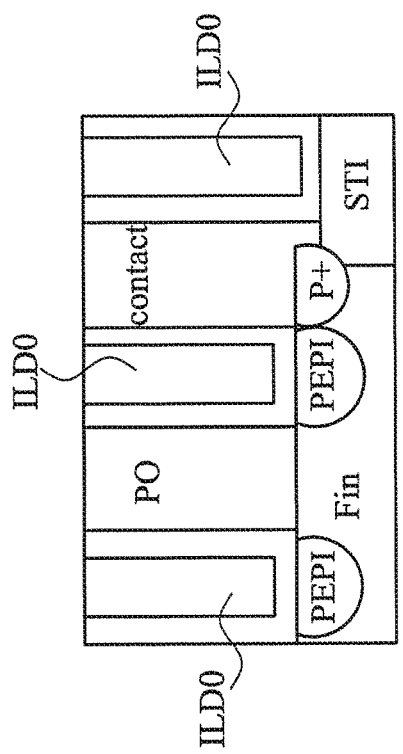
Figure 9B:
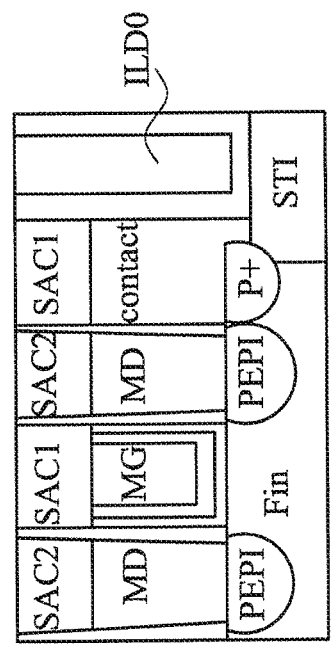

Alternatively, in accordance with another embodiment of the present disclosure, as shown in FIG. 9A, the contact can be formed after depositing and performing a planarization operation (e.g., CMP) on the inter-level dielectric ILD0. Accordingly, the structure after forming the contacts, as shown in FIG. 9B, includes a cap layer SAC1 such as silicon nitride, silicon carbide, silicon oxide covering the metal gate layer MG and covering the contact over the doped semiconductor region P+, and a cap layer SAC2 such as silicon nitride, silicon carbide, silicon oxide but different from the cap layer SAC1 over the metal contacts MD covering the source and drain regions PEPI.

Figure 10A:
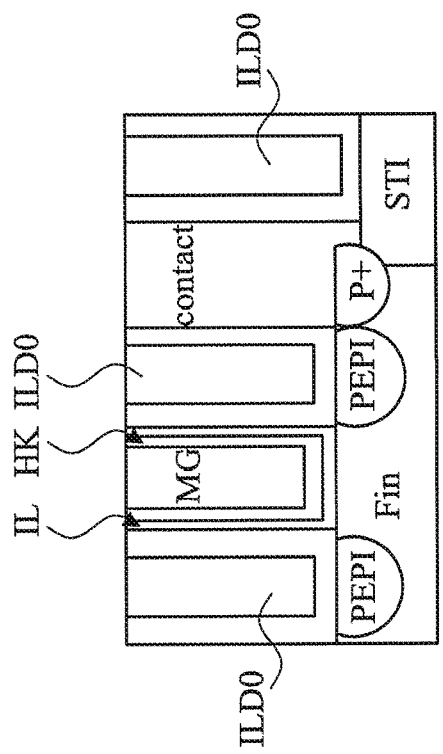
Figure 10B:
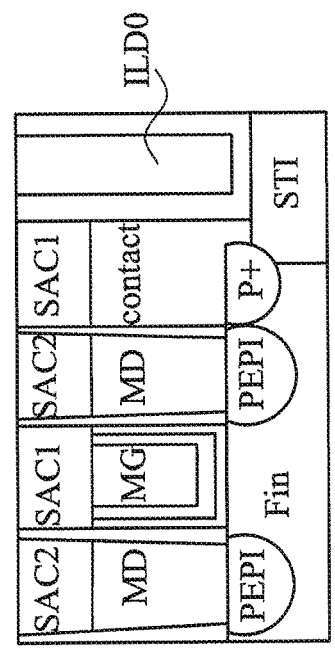

Furthermore, in accordance with another embodiment of the present disclosure, the contact can be formed after forming an interfacial dielectric IL and a high-k dielectric HK, as shown in FIG. 10A. In this case, the structure after forming the contacts, as shown in FIG. 10B, includes a cap layer SAC1 such as silicon nitride, silicon carbide, silicon oxide covering the metal gate layer MG and the doped semiconductor region P+, and a cap layer SAC2 such as silicon nitride, silicon carbide, silicon oxide but different from the cap layer SAC1 over the metal contacts MD over the source and drain regions PEPI.

According to an aspect of the present disclosure, by implementing the aforementioned buried contacts rather than butted contacts in an SRAM to connect metal contacts and gate electrodes/layers, insufficient overlay budget and potential short-circuit, common issues in the SRAM when pitch continues to shrink to meet density requirement for FinFET below 10 nm, can be avoided. Although the manufacturing operations and the structure for an SRAM cell are described in the foregoing embodiments, the manufacturing operations and the structure can be applied to other circuits, such as a logic circuit, in which a gate electrode and the adjacent source or drain region is electrically connected.

According to an aspect of the present disclosure, a Static Random Access Memory (SRAM) cell includes a first pull-up transistor and a first pull-down transistor, a second pull-up transistor and a second pull-down transistor, and first and second pass-gate transistors. A first buried contact electrically connects a drain region of the first pull-up transistor and gate electrodes of the second pull-up transistor and the second pull-down transistor, and includes a first metal layer formed in a region confined by spacers of a first gate layer by which the gate electrodes of the second pull-up transistor and the second pull-down transistor are formed and a first electrically conductive path formed at a level below the spacers of the first gate layer. A second buried contact electrically connects a drain region of the second pull-up transistor and gate electrodes of the first pull-up transistor and the first pull-down transistor, and includes a second metal layer formed in a region confined by spacers of a second gate layer by which the gate electrodes of the first pull-up transistor and the first pull-down transistor are formed and a second electrically conductive path formed at the level below the spacers of the second gate layer.

According to another aspect of the present disclosure, a semiconductor device includes a first transistor, source, drain, and channel regions of which are formed of a first semiconductor fin protruding from a substrate, a second transistor, source, drain, and channel regions of which are formed of a second semiconductor fin protruding from the substrate, and a buried contact electrically connecting the drain region of the first transistor and a gate electrode of the second transistor and including a metal layer formed in a region confined by spacers of the gate electrode of the second transistor and an electrically conductive path formed at a level below the spacers.

According to another aspect of the present disclosure, a method of manufacturing a semiconductor device includes forming first and second transistors in first and second semiconductor fins, and forming a buried contact electrically connecting a drain region of the first transistor and a gate electrode of the second transistor and including a metal layer formed in a region confined by spacers of the gate electrode of the second transistor and an electrically conductive path formed at a level below the spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) cell, comprising:

a first pull-up transistor and a first pull-down transistor;

a second pull-up transistor and a second pull-down transistor;

first and second pass-gate transistors;

a first buried contact electrically connecting a drain region of the first pull-up transistor and gate electrodes of the second pull-up transistor and the second pull-down transistor, and including a first metal layer formed in a region confined by spacers of a first gate layer by which the gate electrodes of the second pull-up transistor and the second pull-down transistor are formed and a first electrically conductive path formed at a level below the spacers of the first gate layer; and a second buried contact electrically connecting a drain region of the second pull-up transistor and gate electrodes of the first pull-up transistor and the first pull-down transistor, and including a second metal layer formed in a region confined by spacers of a second gate layer by which the gate electrodes of the first pull-up transistor and the first pull-down transistor are formed and a second electrically conductive path formed at the level below the spacers of the second gate layer.

2. The SRAM cell of claim 1, wherein the first and second metal layers are formed of one selected from the group consisting of tungsten, cobalt, titanium, copper, and a combination thereof.

3. The SRAM cell of claim 1, wherein the first metal layer penetrates through the first gate layer, and the second metal layer penetrates through the second gate layer.

4. The SRAM cell of claim 1, wherein:

the first electrically conductive path of the first buried contact includes a first doped semiconductor region electrically connecting the first metal layer and the drain region of the first pull-up transistor to each other, and the second electrically conductive path of the second buried contact includes a second doped semiconductor region electrically connecting the second metal layer and the drain region of the second pull-up transistor to each other.

5. The SRAM cell of claim 1, wherein:

each transistor is a fin field-effect transistor, the first electrically conductive path is formed in a semiconductor fin by which the source and drains of the first pull-up transistor are formed, and the second electrically conductive path is formed in a semiconductor fin by which the source and drains of the second pull-up transistor are formed.

6. The SRAM cell of claim 2, further comprising:

a first metal contact electrically connecting the drain region of the first pull-up transistor and drains of the first pass-gate transistor and the first pull-down transistor;

a second metal contact electrically connecting the drain region of the second pull-up transistor and drains of the second pass-gate transistor and the second pull-down transistor;

third and fourth metal contacts electrically connecting source regions of the first and second pass-gate transistors and first and second bitlines, respectively;

fifth and sixth metal contacts electrically connecting source regions of the first and second pull-up transistors to a first power supply line; and seventh and eighth metal contacts electrically connecting source regions of the first and second pull-down transistors to a second power supply line, wherein the first through eight metal contacts, made of the same material, are formed at the same level with reference to a surface of the substrate on which the SRAM cell is formed.

7. The SRAM cell of claim 6, wherein the first and second metal layers and the first through eight metal contacts are formed at the same level and are made of the same material.

8. The SRAM cell of claim 4, wherein the first and second doped semiconductor regions having a doping concentration from about $5 \times 10^{19}$ cm$^{-3}$ to about $1 \times 10^{20}$ cm$^{-3}$.

9. The SRAM cell of claim 8, wherein an impurity for forming the first and second doped semiconductor regions is one selected from the group consisting of boron, gallium, indium, and a combination thereof.

10. The SRAM cell of claim 4, wherein:

the first buried contact further includes a first silicide layer disposed between the first metal layer and the first doped semiconductor region, and the second buried contact further includes a second silicide layer disposed between the second metal layer and the second doped semiconductor region.

11. The SRAM cell of claim 10, wherein the first and second silicide layers are made of one selected from the group consisting of TiSi, TaSi, NiSi, CoSi, and a combination thereof.

12. A semiconductor device, comprising:

a first transistor, source, drain, and channel regions of which are formed of a first semiconductor fin protruding from a substrate;

a second transistor, source, drain, and channel regions of which are formed of a second semiconductor fin protruding from the substrate; and a buried contact electrically connecting the drain region of the first transistor and a gate electrode of the second transistor, and including a metal layer formed in a region confined by spacers of the gate electrode of the second transistor and an electrically conductive path formed at a level below the spacers.

13. The semiconductor device of claim 12, wherein the metal layer is made of one selected from the group consisting of tungsten, cobalt, titanium, copper, and a combination thereof.

14. The semiconductor device of claim 12, wherein:

the electrically conductive path of the buried contact includes a doped semiconductor region electrically connecting the metal layer and the drain region of the first transistor, and the doped semiconductor region is formed in the first semiconductor fin.

15. The semiconductor device of claim 14, wherein the buried contact further includes a silicide layer disposed between the metal layer and the doped semiconductor region.

16. A method of manufacturing a semiconductor device, comprising steps of:

forming first and second transistors in first and second semiconductor fins, respectively; and forming a buried contact electrically connecting a drain region of the first transistor and a gate electrode of the second transistor and including a metal layer formed in a region confined by spacers of the gate electrode of the second transistor and an electrically conductive path formed at a level below the spacers.

17. The method of claim 16, wherein the metal layer is formed of one selected from the group consisting of tungsten, cobalt, titanium, copper, and a combination thereof.

18. The method of claim 16, wherein the step of forming the buried contact further comprising forming a silicide layer between the metal layer and the electrically conductive path.

19. The method of claim 16, wherein the step of forming the buried contact further comprises forming a doped semiconductor region in the first semiconductor fin to electrically connect the metal layer and the drain region of the first transistor.

20. The method of claim 16, wherein the step of forming the buried contact further comprises growing a doped epitaxy region electrically connecting the metal layer and the drain region of the first transistor.

* * * * *